United States Patent
Jeon

(10) Patent No.: US 7,221,616 B2
(45) Date of Patent: May 22, 2007

(54) WORD LINE DRIVER CIRCUITS FOR USE IN SEMICONDUCTOR MEMORY AND DRIVING METHOD THEREOF

(75) Inventor: Byung-Gil Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 51 days.

(21) Appl. No.: 11/154,621

(22) Filed: Jun. 16, 2005

(65) Prior Publication Data

US 2005/0281071 A1    Dec. 22, 2005

(30) Foreign Application Priority Data

Jun. 18, 2004    (KR) ...................... 10-2004-0045298

(51) Int. Cl.
*G11C 8/00* (2006.01)
(52) U.S. Cl. .................................. 365/230.06; 365/145
(58) Field of Classification Search ............ 365/230.06, 365/145, 189.09, 189.11
See application file for complete search history.

(56) References Cited

U.S. PATENT DOCUMENTS

| 5,598,366 | A  |   | 1/1997  | Kraus et al. |
| 5,774,392 | A  | * | 6/1998  | Kraus et al. ................. 365/145 |
| 5,946,243 | A  | * | 8/1999  | Sim ...................... 365/189.11 |
| 6,430,093 | B1 | * | 8/2002  | Eliason et al. ......... 365/189.11 |
| 6,490,189 | B1 |   | 12/2002 | Kang et al. |

* cited by examiner

*Primary Examiner*—Vu A. Le
(74) *Attorney, Agent, or Firm*—F. Chau & Assoc., LLC

(57) ABSTRACT

Disclosed is a word line driver circuit and a driving method thereof. An input to the circuit has a ground voltage level during a non-selected operating mode and, as the output signal of a word line decoding circuit, is applied at a power source voltage level during a selected operating mode. The output of the circuit has a ground voltage level during the non-selected operating mode and applies a higher voltage than the power source voltage to a word line connected to a memory cell during the selected operating mode. Optionally, a capacitor boosts the output voltage during the selected operating mode.

16 Claims, 6 Drawing Sheets

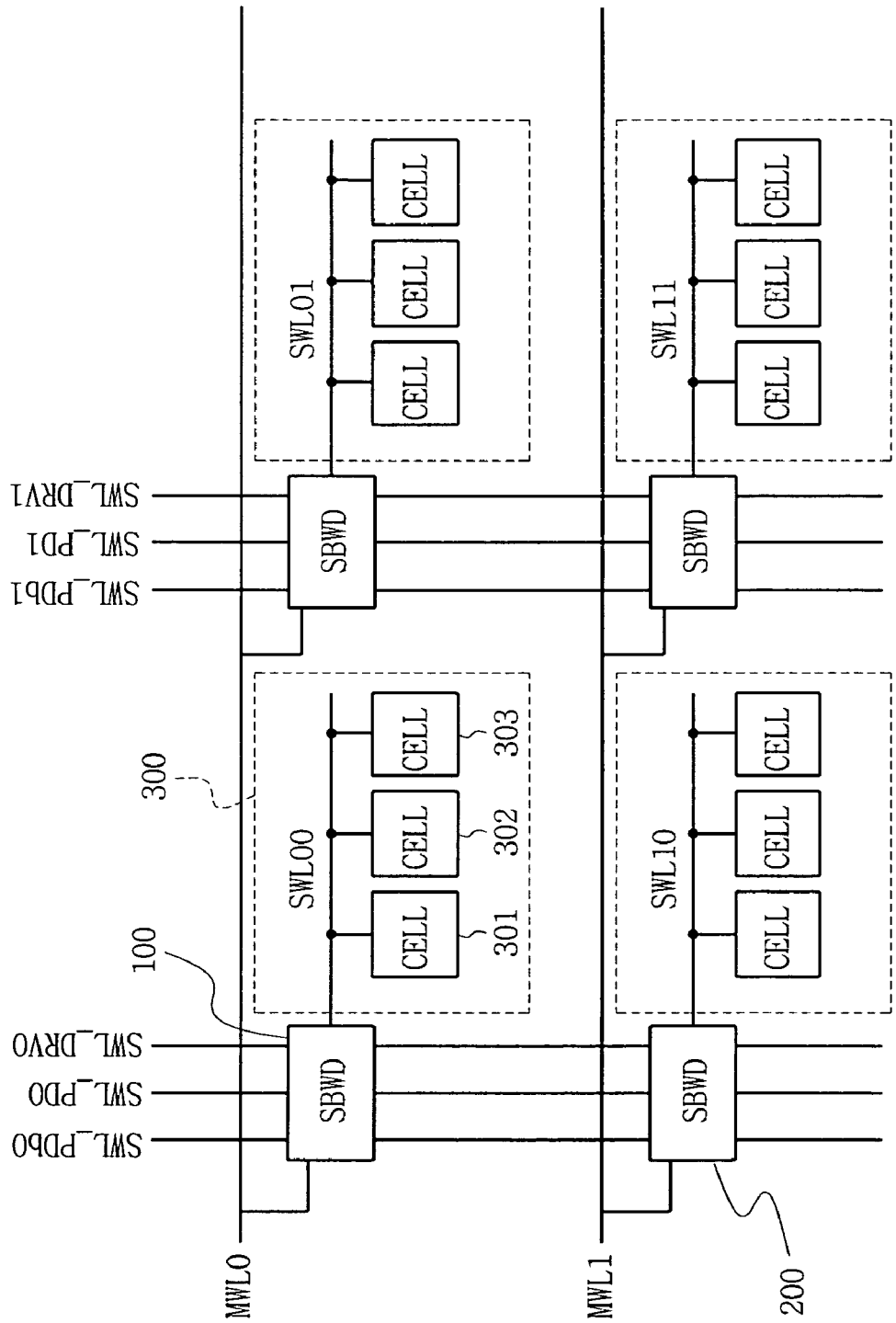

WORD LINE DRIVER CIRCUITS FOR USE IN SEMICONDUCTOR MEMORY AND DRIVING METHOD THEREOF

CROSS-REFERENCE TO RELATED FOREIGN APPLICATION

This application claims the priority of Korean Patent Application No. 10-2004-0045298, filed on Jun. 18, 2004, in the Korean Intellectual Property Office, the disclosure of which is incorporated herein in its entirety by reference.

BACKGROUND OF THE INVENTION

1. Field of the Invention

The present invention relates to an integrated circuit memory device, and more particularly, to a word line driver circuit for supplying a voltage that is higher than the power source voltage requiring an internal boost voltage, and a driving method thereof.

2. Description of the Related Art

In a typical semiconductor memory device that operates at a low voltage, a bootstrap circuit is used to apply a higher voltage than the operating voltage to the capacitor of a memory cell in order to increase the operating speed in reading or writing data. In other words, to prevent or substantially reduce errors in read or write operations, the voltage corresponding to data applied to a bit line is transferred to the capacitor of a memory cell without dropping the threshold voltage of the access transistor of the memory cell, or data stored in the capacitor is supplied to the bit line without dropping the threshold voltage of the access transistor.

A typical word line driver circuit uses a bootstrap circuit for applying a higher voltage than the power source voltage Vcc to a word line.

FIG. 1 illustrates a word line driver according to the prior art.

Referring to FIG. 1, a word line driver circuit according to the prior art includes four transistors N11, N12, N13 and N14, and control signals SWL_PD, SWL_PDb and SWL_DRV. SWL_PD is typically a column select signal and SWL_PDb is the logical inverse of SWL_PD.

In the word line driver circuit, an output signal MWL of a word line decoding circuit (not shown) is typically a row enable signal. The logical state of MWL is transferred to the gate of transistor N12 via transistor N11 that operates from the power source voltage Vcc at its gate. Transistor N12 is configured to transfer control signal SWL_DRV, having an active state voltage level of an external power source voltage Vpp that is a higher voltage than the power source voltage Vcc, to a word line SWL. The word line SWL is also connected to discharge transistor N14 which is operated by inverse control signal SWL_PDb.

During a stand-by mode before active operation of the word line driver, all control signals shown in FIG. 5, except inverse control signal SWL_PDb, are in an inactive state and are applied with a ground voltage level Vss. When a read or write operation starts, an output signal MWL of a word line decoding circuit is asserted with an active state voltage level of the power source voltage Vcc and is applied to the word line driver corresponding to the selected word line. A node voltage between transistor N11 and transistor N12 rises by the voltage level Vcc−Vth obtained by deducting a threshold voltage Vth of transistor N11 from the power source voltage Vcc. The control signal SWL_DRV is then asserted with the active state voltage level of the external power source voltage Vpp and the node voltage between transistor N11 and transistor N12 is boosted to Vcc−Vth+Vpp due to the capacitance between the drain and the gate of transistor N12. As a result, transistor N12 has a sufficient gate voltage Vcc−Vth+Vpp. Therefore, the voltage level Vpp of control signal SWL_DRV is supplied to the word line SWL without dropping the threshold voltage of transistor N12. An access transistor of the memory cell connected to the word line SWL operates by a word line enable signal as the external power source voltage Vpp, thus errors are prevented.

In the word line driver circuit described above, an additional boost circuit or pumping circuit is supplied to obtain a voltage Vpp that is higher than the power source voltage Vcc and the higher voltage is transferred to the word line through control signal SWL_DRV. The additional boost circuit or pumping circuit to generate a voltage Vpp higher than the power source voltage Vcc must be supplied. Thus the chip size becomes larger and the power consumption increases.

Another example of a word line driver circuit according to the prior art is disclosed in U.S. Pat. No. 5,774,392 to William F. Kraus, et. al., which is referred to in FIG. 2.

Referring to FIG. 2, a word line driver circuit according to the prior art employs a ferroelectric capacitor FC0.

The word line driver circuit is constructed of a self boosting circuit and has an advantage of boosting only a selected word line WL0. This has a disadvantage that the data of memory cells connected to non-selected word lines like WL1 may be interfered with by a floating voltage because the non-selected word lines attain a floating state.

If the gain of transistor N0 and transistor N1 is not precisely determined, the voltage level of word line WL0 boosted by ferroelectric capacitor FC0 may excessively increase the voltage level of node WLEN0' when control signal BOOSTDRIVE is applied. Thus, there may be the case that the voltage level of word line WL0 becomes the same as the voltage level of control signal WLCLK due to transistor N1. In other words, the voltage level difference of word line WL0 is insufficient for the operation, and in the worst case, there may be the case that a word line cannot be boosted.

SUMMARY OF THE INVENTION

Exemplary embodiments of the invention provide a word line driver circuit for use in a semiconductor memory device, and a driving method thereof. In the circuit, only a selected word line is boosted, thus reducing chip size and current consumption, and obtaining high integration with low power consumption. The floating of a non-selected word line is prevented, with stabilized operation.

According to one embodiment of the invention, a word line driver circuit for applying a boost voltage to a word line, the boost voltage for operating an access transistor of a memory cell for use in a semiconductor memory device, includes an input node, which has a ground level during a non-selected operating mode and to which the output signal of a word line decoding circuit is applied with a power source voltage level during a selected operating mode; an output node, which has a ground level during the non-selected operating mode, and which applies a voltage having a voltage level higher than the power source voltage, to a word line connected to the memory cell during the selected operating mode; a capacitor, of which one electrode is connected to the output node and which boosts the output node to a voltage having a higher voltage level than the power source voltage during the selected operating mode; a first transistor connected between the input node and the output node and controlled by a first control signal, the first transistor for floating the output node during the selected operating mode; a second transistor connected between the input node and a control node and operating by the power source voltage, the second transistor for floating the control node during the selected operating mode; and a third transistor connected between a node to which a second control signal is applied, and another electrode of the capacitor, and controlled by the voltage of the control node, the third transistor for transferring the second control signal to the capacitor during the selected operating mode.

The word line driver circuit may further include a switching device to discharge the output node to a ground level during a stand-by mode. The non-selected operating mode may be for the case where a word line is not selected. The selected operating mode is for the case where a word line is selected and the output signal of a word line decoding circuit is applied. The first to third transistors and the switching device may be NMOS transistors. The first control signal and the second control signal may have a voltage level of the power source voltage during the non-selected and selected operating modes. The capacitor may be a ferroelectric capacitor.

According to another embodiment of the invention, a driving method of a word line driver circuit for applying a boost voltage to a word line, the boost voltage for operating an access transistor of a memory cell for use in a semiconductor memory device, includes transferring the output signal of a word line decoding circuit applied to an input node, to a control node; floating an output node in a state that the output node rises to a voltage level equal to or lower than the voltage level of a power source voltage by a first control signal; and floating a control node in a state where the control node rises to a higher voltage level than the power source voltage by an applied second control signal, and increasing the output node to a higher voltage level than the power source voltage by a capacitor responding to the second control signal, and outputting the boost voltage.

BRIEF DESCRIPTION OF THE DRAWINGS

Exemplary embodiments of the invention are described with reference to the accompanying drawings, of which:

FIG. 6 shows a circuit diagram of a semiconductor memory device illustrating a memory cell array having an installation of the word line driver circuit shown in FIG. 3.

DETAILED DESCRIPTION OF THE INVENTION

Exemplary embodiments of the present invention will be described with reference to FIGS. 3 and 6.

Figure 1:
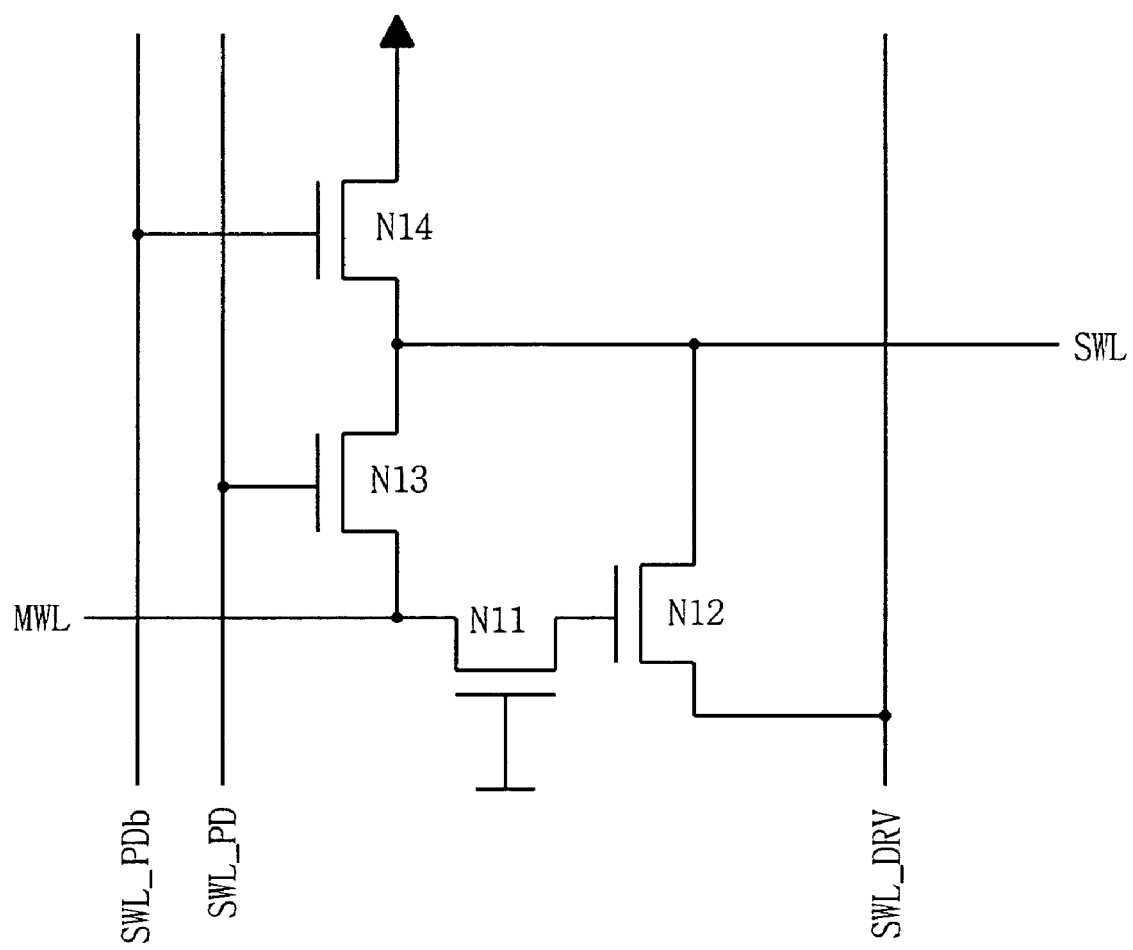
FIG. 1 shows a circuit diagram illustrating a conventional word line driver circuit.
Figure 2:
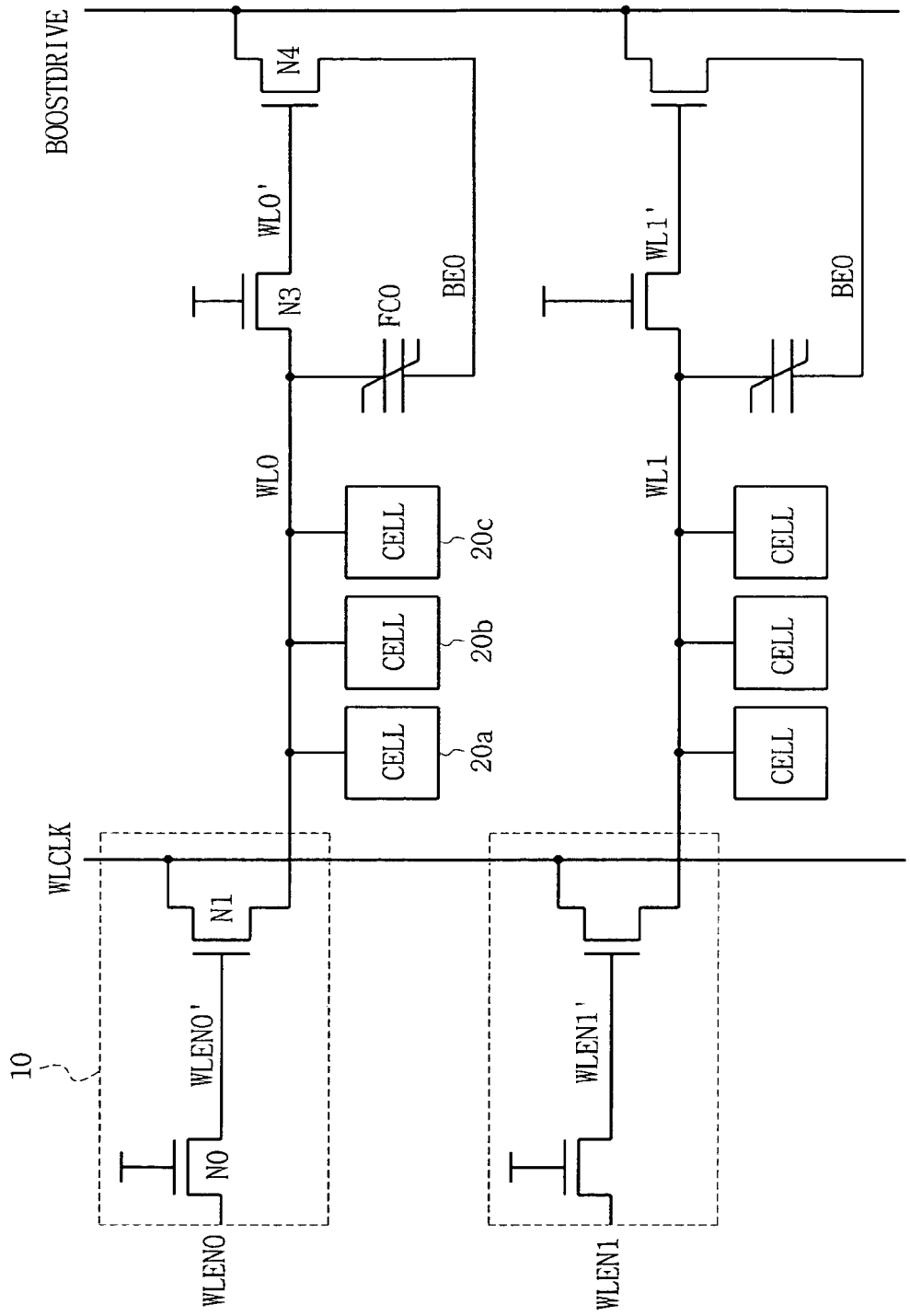
FIG. 2 shows a circuit diagram illustrating another conventional word line driver circuit.
Figure 3:
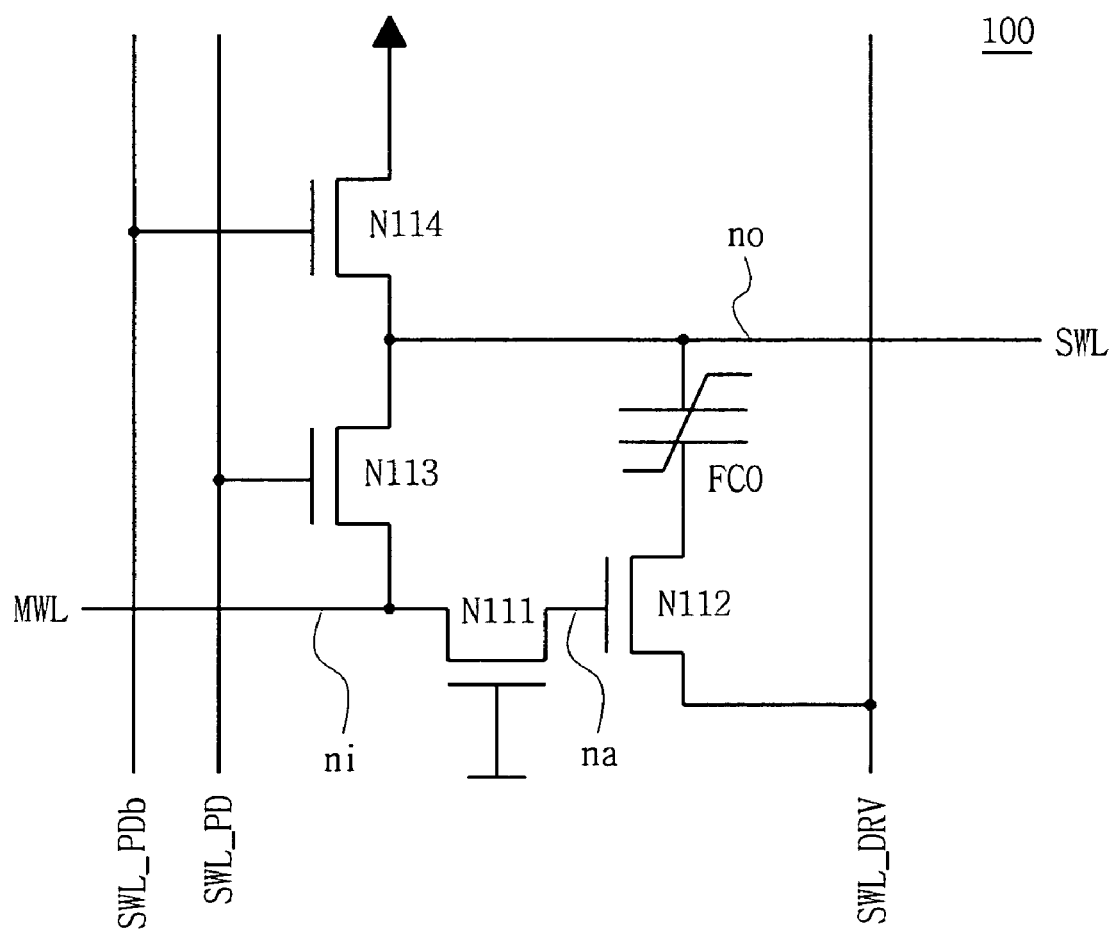
FIG. 3 shows a circuit diagram illustrating a word line driver circuit according to an exemplary embodiment of the present invention.

FIG. 3 illustrates a word line driver circuit for use in a semiconductor memory device according to an exemplary embodiment of the present invention. The word line driver circuit according to an exemplary embodiment drives word lines SWL individually connected with the memory cells that constitute a memory cell array of a semiconductor memory device.

A non-selected operating mode described shortly indicates an operating mode of a word line driver circuit for the case where a word line is not selected in a read or write operation. A selected operating mode indicates an operating mode of a word line driver in the case where a word line is selected and the output signal of a word line decoding circuit (not shown) is asserted. A stand-by mode denotes an operating mode of a word line driver where a read or write operation is not to be performed and a word line is not selected.

Referring to FIG. 3, a word line driver circuit 100 connected to one word line SWL includes first to third transistors N113, N111 and N112, a switching device N114, and one ferroelectric capacitor FC0, which has a connection configuration with an input node (ni), an output node (no) and a control node (na).

The input node (ni) has a ground voltage level Vss during the non-selected operating mode, and during the selected operating mode it has the voltage level of an output signal MWL of a word line decoding circuit (not shown) which is asserted with an active state voltage level of a power source voltage Vcc.

The output node (no) has the ground voltage level Vss during the non-selected operating mode, and during the selected operating mode the output node (no) applies a voltage Vpp having a higher voltage level than the power source voltage Vcc to the word line SWL connected to a memory cell (not shown).

In the ferroelectric capacitor FC0, one electrode is connected to the output node (no), and the ferroelectric capacitor FC0 boosts the output node (no) to the voltage Vpp having a higher voltage level than the power source voltage Vcc during the selected operating mode.

The ferroelectric capacitor FC0 is the type of capacitor that constitutes a memory cell in an FeRAM (Ferroelectric Random Access Memory; FeRAM, FRAM), and may be a capacitor that uses a ferroelectric thin film such as a dielectric film. The ferroelectric film of the ferroelectric capacitor FC0 may be constructed of any one of the films selected from PZT ($Pb\ Zr_x\ Ti_{1-x}\ O_3$) film, SBT ($Sr\ Bi_2\ Ta_2\ O_9$) film and LBT ($La_x\ Bi_{4-x}\ Ti_3\ O_{12}$) film.

The first transistor N113 is connected between the input node (ni) and the output node (no), and is controlled by a first control signal SWL_PD, and floats the output node (no) during the selected operating mode. The first transistor N113 discharges the output node (no) to the ground voltage level Vss during the non-selected operating mode so as to prevent the floating of word line SWL connected to the output node (no). The first transistor N113 may be an NMOS transistor.

The second transistor N111 is connected between the input node (ni) and the control node (na), and operates from the power source voltage Vcc, and floats the control node (na) during the selected operating mode. The second transistor N111 may be an NMOS transistor.

The third transistor N112 is connected between a node to which a second control signal SWL_DRV is applied, and the other electrode that is not connected to the output node (no) of the ferroelectric capacitor FC0. The third transistor N112 is controlled by the voltage of the control node (na), and transfers the second control signal SWL_DRV to the ferroelectric capacitor FC0 during the selected operating mode. The third transistor N112 may be an NMOS transistor.

In the word line driver circuit 100, the switching device, N114 is additionally provided to discharge the output node (no) to the ground voltage level Vss by an inverse control signal SWL_PDb during the stand-by mode and not during the non-selected and selected operating modes. The switching device N114 may be an NMOS transistor.

Herewith, the first control signal SWL_PD and the second control signal SWL_DRV have the voltage level of the power source voltage Vcc during the non-selected and selected operating modes, and may have the ground voltage level Vss during the stand-by mode. The inverse control signal SWL_PDb has the voltage level of the power source voltage Vcc during the stand-by mode, and may have the ground voltage level Vss during the non-selected and selected operating modes.

Figure 4:
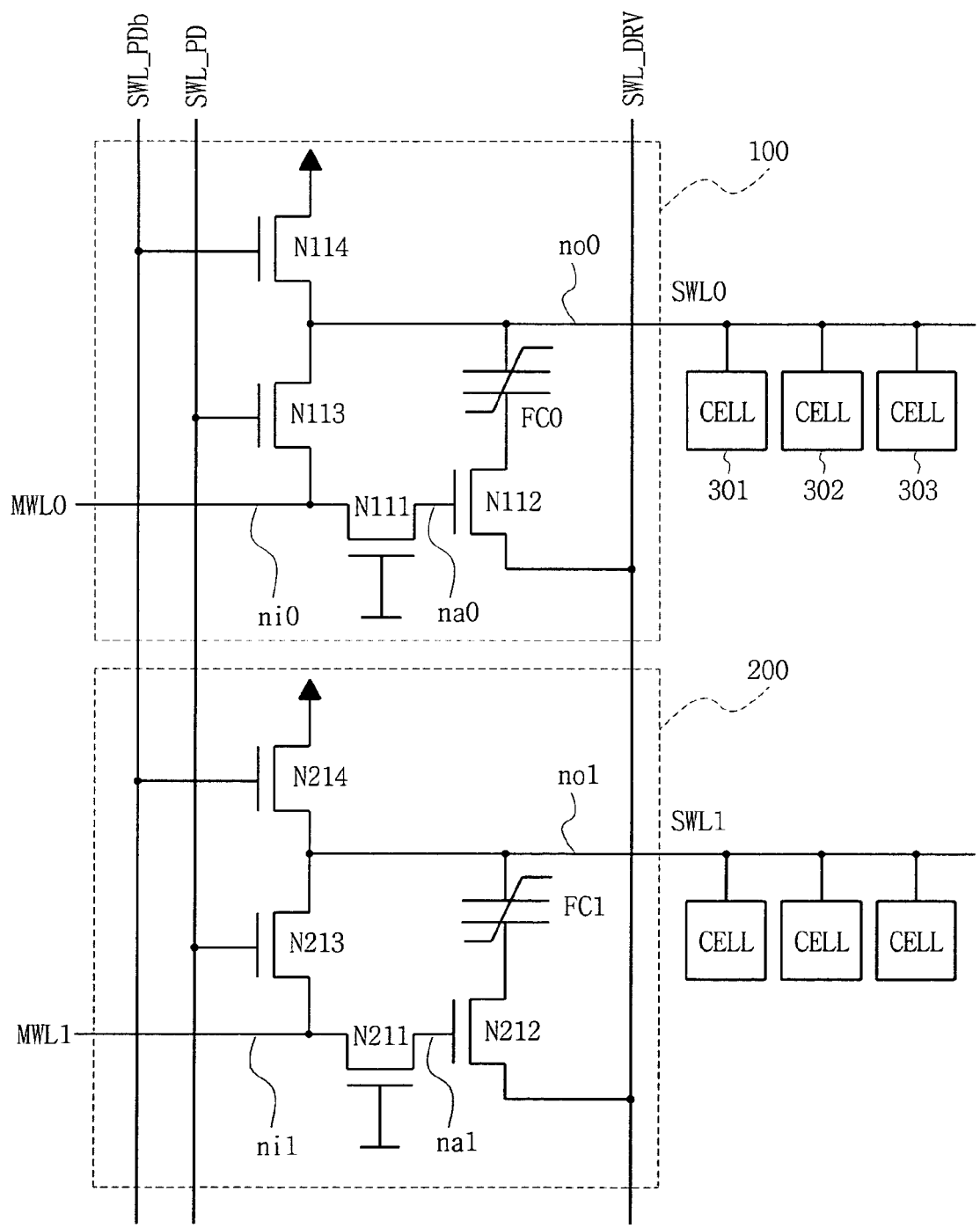
FIG. 4 shows a circuit diagram of a word line driver circuit for use in a semiconductor memory device shown in FIG. 3.
Figure 5:
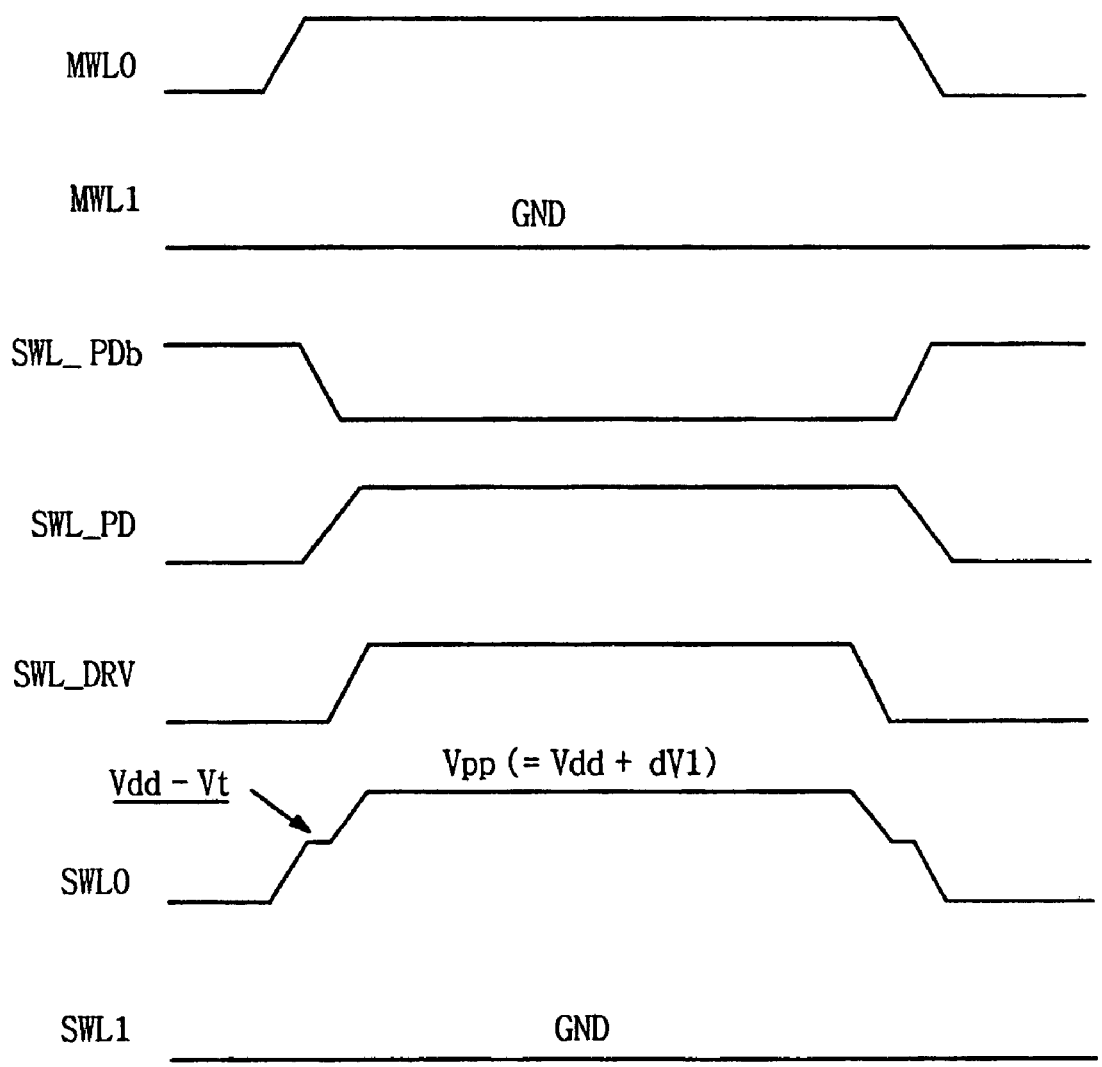
FIG. 5 shows a timing diagram for operations referred to in FIG. 4.

FIG. 4 is a circuit diagram illustrating two word line driver circuits as shown in FIG. 3 operated in the non-selected and selected operating modes in a semiconductor memory device. FIG. 5 is a timing diagram for the operations referred to in FIG. 4.

With reference to FIG. 4, a first word line driver circuit 100 connected to a first word line SWL0 is illustrated in a selected operating mode in which the first word line SWL0 connected to memory cells 301, 302 and 303 is enabled and a first output signal MWL0 of a word line decoding circuit is asserted with an active state voltage level of the power source voltage Vcc. Also, a second word line driver circuit 200 connected to a second word line SWL1 is illustrated in a non-selected operating mode in which the second word line SWL1 is not enabled, a second output signal MWL1 of a word line decoding circuit has an inactive state ground level Vss and the input node (ni1) of the second word line driver circuit 200 is grounded. The first word line driver circuit 100 and the second word line driver circuit 200 share control signals SWL_PD, SWL_PDb and SWL_DRV.

Operations of the word line driver circuits 100 and 200 according to an exemplary embodiment of the invention will be described referring to FIGS. 4 and 5, as follows.

In a stand-by mode where a read or write operation is not to be performed, first and second control signals SWL_PD and SWL_DRV have an inactive state ground voltage level Vss. Only an inverse control signal SWL_PDb operates switching devices N114 and N214 from the voltage level of the power source voltage vcc and discharges first and second word lines SWL0 and SWL1.

When a read or write operation starts and becomes either a selected or non-selected operating mode; in a first word line driver circuit 100 a first word line SWL0 is enabled, a first output signal MWL0 of a word line decoding circuit is input in an active state voltage level of the power source voltage Vcc, and a selected operating mode starts. In a second word line driver circuit 200, a second output signal MWL1 of a word line decoding circuit becomes an inactive state voltage of ground voltage Vss and a non-selected operating mode starts.

The operation of the first word line driver circuit 100 during the selected operating mode will be described as follows. When a first output signal MWL0 of a word line decoding circuit is input in an active state voltage level of the power source voltage Vcc, the first output signal MWL0 of a word line decoding circuit is transferred to a control node (na0) through a second transistor N111 turned on by power source voltage Vcc. Thus, the voltage level of the control node (na0) is Vcc−Vt obtained by deducting a threshold voltage Vt of the second transistor N111 from the power source voltage Vcc. Then, when an inverse control signal SWL_PDb is disabled as ground level Vss and a first control signal SWL_PD is enabled in a level of power source voltage Vcc, the voltage level of an output node (no0) connected to a first word line SWL0 also rises to the voltage Vcc−Vt obtained by deducting the threshold voltage Vt of the first transistor N113 from the power source voltage Vcc.

When a second control signal SWL_DRV is enabled in an active state voltage level of power source voltage Vcc, the voltage of the control node (na0) rises to Vcc+dV0 higher than power source voltage Vcc, by a self-boosting generated by the gain of the second transistor N111 and a third transistor N112.

The voltage level dV0 can be higher than the sum of the threshold voltage Vt of the second transistor N111 and the threshold voltage Vt of the third transistor N112. Herewith, an ideal voltage level of control node (na0) may be '2Vcc−Vt' obtained by deducting the threshold voltage Vt of the second transistor N111 from the voltage level corresponding to twice the power source voltage Vcc. The second transistor N111 floats control node (na0) to prevent the voltage level of the control node (na0) from being lowered.

The voltage level of the control node (na0) rises to Vcc+dV0, thus the voltage level of the second control signal SWL_DRV is transferred to one electrode of the ferroelectric capacitor FC0 to Vcc without a drop through the third transistor N112. Thus, one electrode of the ferroelectric capacitor FC0 is changed from ground voltage Vss to the power source voltage Vcc, and so the voltage level of the output node (no0) is boosted to the voltage Vcc+dV1 higher than the power source voltage Vcc, by a self-boosting generated in the ferroelectric capacitor FC0.

The output node (no0) is floated by the first transistor N113, thus there is no current loss and the voltage level of the output node (no0) is prevented from being lowered. By controlling the capacitance of the ferroelectric capacitor FC0 and the parasitic capacitance of the first word line SWL0, the voltage level dV1 may be higher than the sum of the threshold voltage Vt of the first transistor N113 and the threshold voltage Vt of an access transistor (not shown) that constitutes memory cells 301, 302, 303. The ideal voltage level of the output node (no0) may be '2Vcc−Vt' obtained by deducting the threshold voltage Vt of the first transistor N113 from the voltage level corresponding to twice the power source voltage Vcc.

The voltage level Vcc+dV1 of the output node (no0) is transferred to the memory cells 301, 302 and 303 through the first word line SWL0 and controls an access transistor.

Next, a non-selected operating mode in which a word line is not selected will be described through a second word line driver circuit 200. A first word line SWL0 is enabled and a second word line SWL1 is not enabled, thus a second output signal MWL1 of a word line decoding circuit is maintained as a ground level Vss. A first control signal SWL_PD and a second control signal SWL_DRV have an active state voltage level of the power source voltage Vcc, and an inverse control signal SWL_PDb has the ground voltage level Vss.

The first control signal SWL_PD is an active state signal with the power source voltage level Vcc, and turns on a first transistor N213, and prevents the floating of an output node (no1) and maintains a ground level Vss of the output node (no1). Accordingly, an interference of memory cells caused by the floating of the second word line SWL1 can be prevented.

FIG. 6 is a circuit diagram illustrating an example of the word line driver circuit shown in FIG. 3, in a memory cell array.

Referring to FIG. 6, when a memory cell array 300 is selected, a first output signal MWL0 of a first word line decoding circuit (not shown) is asserted with the power source voltage level Vcc, and a second output signal MWL1 of a second word line decoding circuit (not shown) remains at the ground voltage level Vss. A first word line driver circuit 100 connected to the selected memory cell array 300 operates in the selected operating mode, to boost a first word line SWL00 to a voltage level Vpp which is higher than the power source voltage Vcc through a first set of control signals SWL_PD0, SWL_PDb0 and SWL_DRV0. At this time, a second word line driver circuit 200, which shares the first set of control signals SWL_PD0, SWL_PDb0 and SWL_DRV0 with the first word line driver circuit 100 connected to the selected memory cell array 300 from other non-selected memory cell arrays, operates in the non-selected operating mode and discharges a second word line SWL10 to the ground voltage level Vss.

The rest of the non-selected memory cell arrays are determined so that a second set of control signals SWL_PD1, SWL_PDb1 and SWL_DRV1 operate in a stand-by mode. Thus, third and fourth word lines SWL01 and SWL11 are discharged to ground voltage Vss so floating can be prevented.

Though it is advantageous to apply a word line driver circuit for use in a semiconductor memory device according to an exemplary embodiment to an FRAM, it is applicable to a DRAM (Dynamic Random Access Memory), a PRAM (Phase change Random Access Memory) and an MRAM (Magnetic Random Access Memory), and also to other semiconductor memory devices.

As described above, according to an exemplary embodiment of the invention, only a selected word line can be boosted through the use of a ferroelectric capacitor and it is unnecessary to supply an external power source voltage generator thereby reducing chip size to achieve high integration. In addition, current consumption is reduced through the floating of control nodes and output nodes, obtaining low power consumption, and the floating of non-selected word lines is prevented, aiding stability.

While the present invention has been particularly shown and described with reference to exemplary embodiments thereof, it will be understood by those skilled in the art that various changes in form and details may be made therein without departing from the spirit and scope of the present invention as defined by the claims. For example, the internal configuration of the circuit may be changed, or the internal devices of the circuit may be replaced with other equivalent devices. Accordingly, these and other changes and modifications are seen to be within the true spirit and scope of the invention as defined by the claims.

What is claimed is:

1. A word line driver circuit for applying a boost voltage to a word line, wherein the boost voltage is used for operating an access transistor of a memory cell in a semiconductor memory device, the word line driver circuit comprising:
   an input node, which has a ground voltage level during a non-selected operating mode and to which an output signal of a word line decoding circuit is applied with a power source voltage level during a selected operating mode;
   an output node, which has a ground voltage level during the non-selected operating mode, and which applies a voltage having a level higher than a level of the power source voltage to a word line connected to the memory cell during the selected operating mode;
   a capacitor, of which one electrode is connected to the output node and which boosts the output node to a voltage having a level higher than a level of the power source voltage during the selected operating mode;
   a first transistor connected between the input node and the output node and controlled by a first control signal that has a level of the power source voltage during the selected operating mode, wherein the first transistor is for floating the output node during the selected operating mode;
   a second transistor connected between the input node and a control node and operating by the power source voltage, wherein the second transistor is for floating the control node during the selected operating mode; and
   a third transistor connected between a node to which a second control signal that has a level of the power source voltage during the selected operating mode is applied, and another electrode of the capacitor, and controlled by a voltage of the control node, wherein the third transistor is for transferring the second control signal that has a level of the power source voltage to the capacitor during the selected operating mode, whereby the voltage at the output node is substantially equal to two times the power source voltage less a threshold voltage of the second transistor.

2. The circuit of claim 1, further comprising a switching device for discharging the output node to the ground voltage level during a standby mode.

3. The circuit of claim 2, wherein the non-selected operating mode indicates that a word line is not selected, and the selected operating mode denotes that a word line is selected and an output signal of the word line decoding circuit is applied.

4. The circuit of claim 3, wherein the first to third transistors and the switching device are NMOS transistors.

5. The circuit of claim 1, wherein the capacitor is a ferroelectric capacitor.

6. The circuit of claim 5, wherein a ferroelectric film of the ferroelectric capacitor is any one film selected from a PZT(Pb $Zr_x Ti_{1-x} O_3$) film, an SBT($SrBi_2 Ta_2 O_9$) film and an LBT($La_x Bi_{4-x} Ti_3 O_{12}$) film.

7. The circuit of claim 1, wherein the first transistor discharges the output node to the ground level during the non-selected operating mode.

8. A driving method of a word line driver circuit for applying a boost voltage to a word line, the boost voltage for operating an access transistor of a memory cell for use in a semiconductor memory device, the circuit comprising:
   transferring an output signal of a word line decoding circuit applied to an input node, to a control node at a level of power source voltage;
   floating an output node in a state that the output node rises to a voltage level equal to or lower than a level of a power source voltage by a first control signal that has a level of power source voltage; and
   floating a control node in a state that the control node rises to a voltage level higher than the level of a power source voltage by an applied second control signal that has a level of power source voltage, and increasing the output node to a voltage level higher than the level of a power source voltage by a capacitor responding to the second control signal, wherein the voltage level at the output node is substantially equal to two times the power supply voltage less a threshold voltage in a device used to float the control node, and outputting the boost voltage.

9. The method of claim 8, wherein the capacitor is a ferroelectric capacitor.

10. A word line driver circuit for applying a boost voltage to a word line, comprising:
   a row enable input and a column enable input having ground voltage level inactive states and power source voltage level active states;
   an inverse column enable input having a power source voltage level inactive state and a ground voltage level active state;
   a drive enable input having a ground voltage level inactive state and a power source voltage level active state; and
   a word line driver output having a ground voltage level inactive state and a boost voltage level active state,
   wherein the boost voltage at the output node is substantially equal to two times the power supply voltage less a threshold voltage of a device receiving the row enable input, and
   wherein the word line driver output is in its active state when the row enable input, the column enable input, the inverse column enable input and the drive enable input are at their active states, otherwise the word line driver output is at its inactive state.

11. The circuit of claim 10, further comprising a capacitor for providing the boost voltage level.

12. The circuit of claim 11, wherein the capacitor is a ferroelectric capacitor.

13. The circuit of claim 12, wherein the ferroelectric film of the ferroelectric capacitor is any one film selected from a PZT(PbZr$_x$Ti$_{1-x}$O$_3$) film, an SBT(SrBi$_2$Ta$_2$O$_9$) film and an LBT(La$_x$Bi$_{4-x}$Ti$_3$O$_{12}$) film.

14. The circuit of claim 10, wherein the row enable input is connected to the output signal of a word line decoding circuit.

15. The circuit of claim 10, wherein the column enable input is connected to a first control signal that has a level of power source voltage and the inverse column enable signal is connected to the inverse of the first control signal that has a ground voltage level.

16. The circuit of claim 10, wherein the drive enable input is connected to a second control signal that has a level of the power source voltage.

* * * * *